United States Patent [19]

Tondreault

[11] Patent Number: 5,775,925
[45] Date of Patent: *Jul. 7, 1998

[54] ELECTRICAL CONNECTOR SOCKET WITH DAUGHTERCARD EJECTOR

[75] Inventor: Robert J. Tondreault, Louisville, Ky.

[73] Assignee: Robinson Nugent, Inc., New Albany, Ind.

[*] Notice: The term of this patent shall not extend beyond the expiration date of Pat. No. 5,364,282.

[21] Appl. No.: 748,357

[22] Filed: Nov. 13, 1996

Related U.S. Application Data

[63] Continuation of Ser. No. 590,772, Jan. 24, 1996, Pat. No. 5,603,625, which is a continuation of Ser. No. 298,118, Aug. 30, 1994, abandoned, which is a continuation of Ser. No. 107,274, Aug. 16, 1993, Pat. No. 5,364,282.

[51] Int. Cl.$^6$ .................................................. H01R 13/629
[52] U.S. Cl. .................................................. 439/157
[58] Field of Search ........................... 439/153, 157, 439/159, 160

[56] References Cited

U.S. PATENT DOCUMENTS

| | | | |
|---|---|---|---|
| 2,987,693 | 6/1961 | Wamsley | 439/157 |
| 3,150,906 | 9/1964 | Chambon et al. | 439/157 |
| 3,271,626 | 9/1966 | Hownilka | 439/152 |
| 3,360,689 | 12/1967 | Haury | 439/152 |
| 3,853,379 | 12/1974 | Goodman et al. | 355/265 |
| 4,057,879 | 11/1977 | Eigenbrode | 439/358 |
| 4,070,081 | 1/1978 | Takahashi | 439/157 |
| 4,075,444 | 2/1978 | Hollingsead et al. | 439/252 |
| 4,197,572 | 4/1980 | Aimar | 439/160 |
| 4,241,966 | 12/1980 | Gomez | 439/157 |
| 4,582,378 | 4/1986 | Fruchard | 439/157 |
| 4,603,375 | 7/1986 | Miller et al. | 439/160 |
| 4,638,405 | 1/1987 | Smith | 439/152 |
| 4,698,024 | 10/1987 | Maxwell | 439/62 |
| 4,740,164 | 4/1988 | Schulz et al. | 439/157 |
| 4,780,792 | 10/1988 | Harris et al. | 361/737 |
| 4,836,790 | 6/1989 | Narita | 439/159 |
| 4,898,540 | 2/1990 | Saito | 439/153 |
| 4,973,255 | 11/1990 | Rudoy | 439/157 |
| 4,990,097 | 2/1991 | Billman et al. | 439/160 |
| 4,996,631 | 2/1991 | Freehauf | 361/798 |
| 5,013,264 | 5/1991 | Tondreault | 439/636 |
| 5,057,029 | 10/1991 | Noorily | 439/160 |
| 5,066,241 | 11/1991 | Hills | 439/260 |
| 5,074,800 | 12/1991 | Sasao et al. | 439/157 |
| 5,106,315 | 4/1992 | Billman et al. | 439/160 |
| 5,147,211 | 9/1992 | Tondreault et al. | 439/160 |
| 5,163,847 | 11/1992 | Regnier | 439/157 |
| 5,167,517 | 12/1992 | Long | 439/160 |
| 5,211,568 | 5/1993 | Yamada et al. | 439/157 |
| 5,254,017 | 10/1993 | Tondreault et al. | 439/637 |
| 5,302,133 | 4/1994 | Tondreault | 439/157 |

FOREIGN PATENT DOCUMENTS

| 213068 | 8/1990 | Japan | 439/157 |
|---|---|---|---|

*Primary Examiner*—Gary F. Paumen
*Attorney, Agent, or Firm*—Barnes & Thornburg

[57] ABSTRACT

An electrical connector is provided for receiving a daughtercard having an end edge formed to include a notch therein and having a plurality of conductive surfaces formed thereon. The connector includes a socket formed to include an elongated slot for receiving the daughtercard therein and including a plurality of electrical terminals for engaging the plurality of conductive surfaces formed the daughtercard for electrically coupling the daughtercard to the socket. The connector also includes an ejector coupled to an end of the socket. The ejector includes first and second side panels defining a slot therebetween for receiving the end edge of the daughtercard therein, and first and second raised surfaces formed on the first and second side panels of the ejector, respectively, for engaging opposite sides of daughtercard to apply a retention force directed normal to the daughtercard upon insertion of the daughtercard into the socket. The ejector also includes a locking head formed integrally with the first side panel and configured to engage the notch formed in the daughtercard to provide a vertical retention force to the daughtercard.

10 Claims, 1 Drawing Sheet

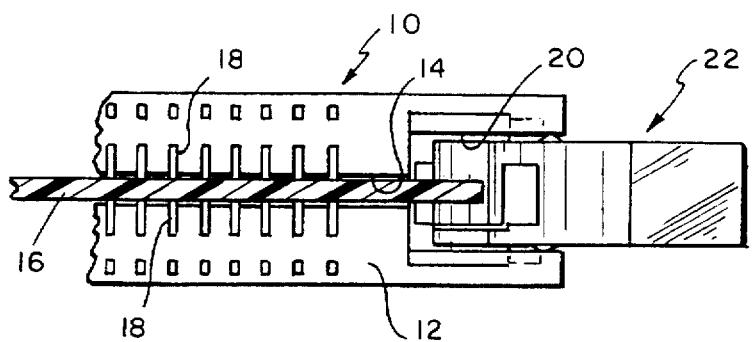
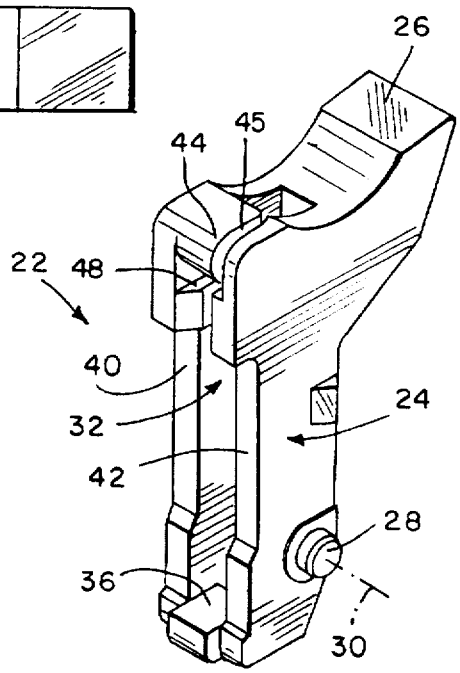
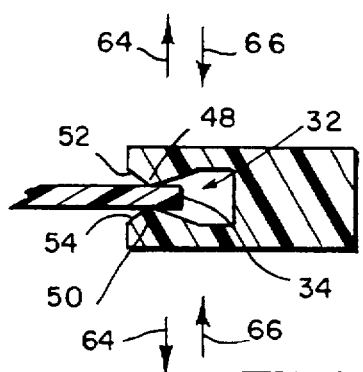
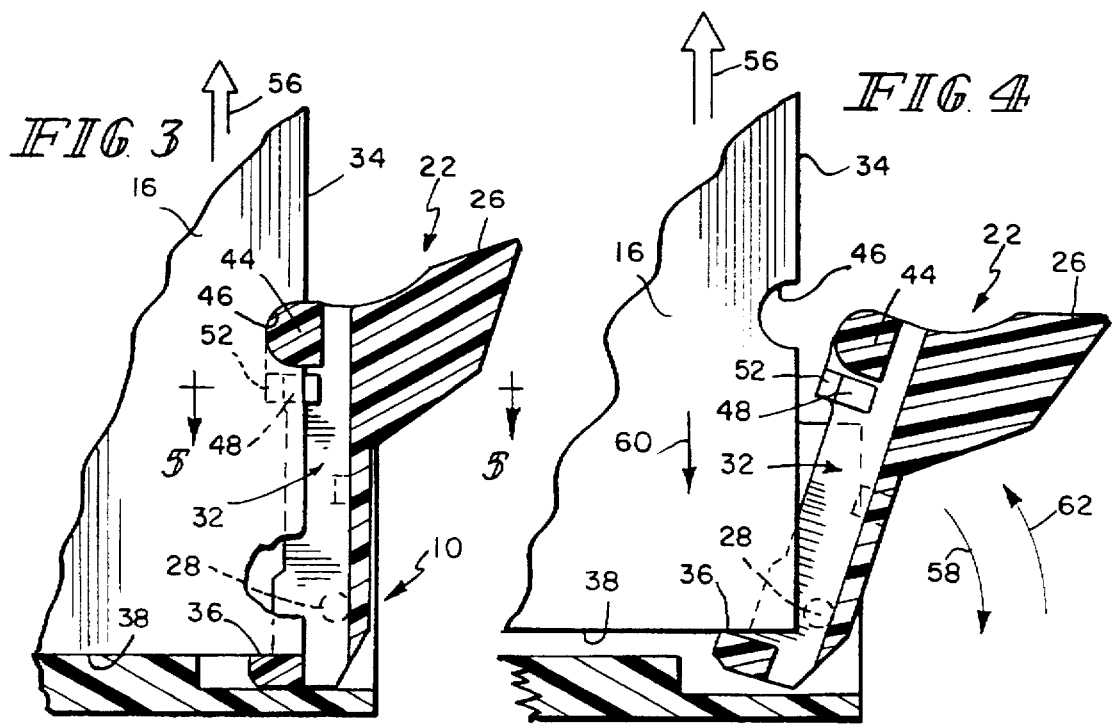

ELECTRICAL CONNECTOR SOCKET WITH DAUGHTERCARD EJECTOR

This application is a continuation of application Ser. No. 08/590,772 filed Jan. 24, 1996, now U.S. Pat. No. 5,603,625, which is a continuation of application Ser. No. 08/298,118 filed Aug. 30, 1994, now abandoned, which is a continuation of application Ser. No. 08/107,274 filed Aug. 16, 1993, now U.S. Pat. No. 5,364,282.

BACKGROUND AND SUMMARY OF THE INVENTION

The present invention relates to an electrical connector socket having an ejector mechanism for removing a daughtercard or module from the socket. More particularly, the present invention relates to an improved electrical connector which provides a retention force when the daughtercard is inserted into the socket and also permits the daughtercard to be easily ejected from the socket when desired.

It is well known to provide electrical connector sockets, such as Single In-line Memory Module (SIMM) sockets, for interconnecting a first printed circuit board or mother board to a second printed circuit board or daughtercard. Typically, the sockets are formed to include an elongated slot and a plurality of electrical terminals coupled to the housing adjacent to the slot. When the daughtercard is inserted into the slot of the socket, conductive surfaces on the daughtercard engage the terminals to couple the daughtercard to the socket electrically. The terminals are also coupled to conductive traces on the mother board so that when the daughtercard is inserted into the socket, the daughtercard is electrically coupled to the mother board. For examples of SIMM socket configurations see, for example, U.S. Pat. No. 5,013,264 to Tondreault and U.S. Pat. No. 5,254,013, owned by the assignee of the present invention, and incorporated herein by reference.

One problem associated with conventional electrical connectors is that it is often difficult to extract a daughtercard that is held in a socket formed in an electrical connector. It is understood that a plurality of sockets may be located adjacent each other with daughtercards in each of the sockets. In such tight quarters it is often difficult for a technician to remove a selected daughtercard from the connector socket manually by hand or using a tool. Unless precautions are taken, the daughtercard can be damaged during extraction of the daughtercard from the socket. Therefore, it is desirable to provide an ejector mechanism coupled to the socket to facilitate ejection of the daughter card from the socket.

It is known to provide ejectors coupled to the sockets to assist with the removal of daughtercards from the socket. One such ejector is disclosed in U.S. Pat. No. 5,147,211 to Tondreault et al. The '211 patent discloses an ejector for selectively ejecting one of first and second daughtercards located in adjacent elongated slots of a socket. The device disclosed in the '211 patent therefore provides means for selectively ejecting first and second daughtercards in a dual-row socket.

The present invention provides an improved design for an ejector for a single row socket. It is known to provide ejectors for such single row sockets. See, for example, U.S. Pat. No. 4,990,097 to Billman, et al. The '097 patent discloses a connector having extraction members which can be lifted upwardly relative to the socket to permit a circuit board to be withdrawn from the socket. However, it is often difficult to access the extraction members. A great deal of room is required beyond the edge of the extraction members to permit a technician to grip under a ledge of the extraction members and lift. In addition, a relatively large amount of force must be applied to the extraction members to remove the circuit board from the socket.

A problem associated with conventional sockets is that the daughtercard tends to dislodge from the socket during handling or during motor or fan vibration. Such dislodging can cause intermittent or failed signal paths between the daughtercard and the mother board.

The ejector of the present invention is specifically designed for use with a printed circuit board or daughtercard which is formed to include a notched portion in an end edge of the daughtercard. The use of such daughtercards is becoming more widespread in the industry.

According to one aspect of the invention, an electrical connector is provided for receiving a daughtercard having an end edge formed to include a notch therein and having a plurality of conductive surfaces formed thereon. The connector includes a socket formed to include an elongated slot for receiving the daughtercard therein and including a plurality of electrical terminals for engaging the plurality of conductive surfaces formed the daughtercard for electrically coupling the daughtercard to the socket. The connector also includes an ejector coupled to an end of the socket. The ejector includes means for engaging opposite sides of the daughtercard upon insertion of the daughtercard into the socket to retain the daughtercard within the socket, means for engaging the notch formed in the end edge of the daughtercard to provide a further retention force to the daughtercard, and means for ejecting an end of the daughtercard adjacent the ejector out of the elongated slot upon movement of the ejector relative to the socket.

In the illustrative embodiment, the ejector includes first and second side panels defining a slot therebetween for receiving an end edge of the daughtercard therein. The means for engaging opposite sides of the daughtercard includes first and second raised surfaces formed on the first and second side panels of the ejector, respectively, for engaging opposite sides of daughtercard. The first and second raised surfaces each include a ramp surface configured to engage the daughtercard and to separate the first and second side panels upon insertion of the daughtercard into the socket so that the first and second side panels apply a normal retention force to opposite sides of the daughtercard.

Also in the illustrated embodiment, the means for engaging the notch includes a locking head formed on the ejector and configured to engage the notch formed in the end edge of the daughtercard to provide a vertical retention force to the daughtercard. The locking head is formed integrally with the first side panel.

Additional objects, features, and advantages of the invention will become apparent to those skilled in the art upon consideration of the following detailed description of a preferred embodiment exemplifying the best mode of carrying out the invention as presently perceived.

BRIEF DESCRIPTION OF THE DRAWINGS

The detailed description particularly refers to the accompanying figures in which:

FIG. 1 is a top plan view illustrating a socket of the present invention including an elongated slot for receiving the daughtercard therein, a plurality of contacts for engaging conductive surfaces on the daughtercard, and an ejector apparatus pivotably coupled to one end of the socket;

FIG. 2 is a perspective view illustrating the ejector apparatus of the present invention;

FIG. 3 is a partial sectional view through the socket of FIG. 1 illustrating the position of the ejector and the daughtercard after the daughtercard is completely inserted into the socket;

FIG. 4 is a partial sectional view similar to FIG. 3 illustrating the ejection of the daughtercard from the socket using the ejector of the present invention; and FIG. 5 is a sectional view taken along lines 5—5 of FIG. 3 further illustrating the configuration of the ejector apparatus.

DETAILED DESCRIPTION OF THE DRAWINGS

Referring now to the drawings, FIG. 1 illustrates a socket 10 of the present invention. Socket 10 includes a housing 12 formed to include an elongated slot 14 therein for receiving a daughtercard 16. Socket includes a plurality of contacts 18 for engaging conductive surfaces (not shown) on daughtercard 16 when daughtercard 16 is inserted into socket 10. Both ends of socket 10 are formed to include an opening 20 having an identical configuration for receiving an ejector 22 therein. An ejector 22 is pivotably coupled to each end of socket 10 within opening 20.

FIG. 2 illustrates one ejector 22 which is configured to retain and eject one end of daughtercard 16 adjacent ejector 22. The ejector at the opposite end of socket 10 is a mirror image of ejector 22. Ejector 22 includes a body portion 24 and a head 26 formed integrally with body portion 24 to facilitate pivotal movement of ejector 22. Head 26 provides a "finger shelf" on which to push when actuating ejector 22. A pair of axles 28 are formed on opposite sides of body portion 24. Axles 28 define a pivot axis 30 which is generally perpendicular to elongated slot 14 formed along a longitudinal axis of socket 10. Body portion 24 of ejector 22 is formed to include a slot 32 therein for receiving an end edge portion 34 of daughtercard 16 as daughtercard 16 is inserted into socket 10. A bottom surface 36 of ejector 22 is configured to engage a bottom surface 38 of daughtercard 16 as daughtercard 16 is inserted into socket 10. Body portion 24 includes first and second side panels 40 and 42 which are spaced apart to define slot 32 therebetween. Body portion includes a single locking head 44 configured to engage a semi-circular notch 46 formed in end edge 34 of daughtercard 16. It is understood that more than one notch 46 may be formed in end edge 34 of daughtercard 16. See, for example, U.S. Pat. No. 5,163,847.

Illustratively, locking head 44 is formed integrally with first side panel 44 and separated from second side panel 42 by slot 44. This permits side panels 40 and 42 to move relative to each other to apply a biasing force to daughtercard 16 and discussed below in detail.

Ejector 22 is also formed to include a pair of raised surfaces 48 and 50 formed on side panels 40 and 42, respectively. Raised surfaces 48 and 50 include leading ramp portions 52 and 54, respectively. Ramps 52 and 54 of raised surfaces 48 and 50, respectively, force side panels 40 and 42 away from each other and permit daughtercard 16 to enter slot 32 during insertion of daughtercard 16.

FIG. 3 illustrates the configuration when daughtercard 16 fully inserted into socket 10. In this configuration, locking head 44 enters notch 46 formed in end edge 34 of daughtercard 16 to prevent daughtercard 16 from moving vertically in the direction of arrow 56 relative to socket 10. In the fully inserted position of FIG. 3, bottom surface 38 of daughtercard 16 abuts bottom surface 36 of ejector 22. Raised surfaces 48 and 50 engage opposite sides of daughtercard 16 at a location spaced apart from notch 46 to apply a horizontal retention force in a direction generally perpendicular or normal to daughtercard 16 to stabilize side-to-side movement of daughtercard 16 within socket 10. Therefore, locking head 44 which engages notch 46 provides a vertical retention force on daughtercard 16 in the direction of arrow 60 in FIG. 5 while opposed raised surfaces 48 and 50 apply a horizontal or normal retention force to daughtercard 16.

When it is desired to eject daughtercard 16 from socket 10, ejector 22 is rotated in the direction of arrow 58 in FIG. 4 so that bottom surface 36 of ejector 22 applies a force to bottom surface 38 of daughtercard 16 to move daughtercard 16 out of socket 10 in the direction of arrow 56. It is understood that an ejector 22 located at each end of socket 10 is rotated to eject both ends of daughtercard 16.

When it is desired to insert daughtercard 16 into socket 10, ejectors 22 are moved to the open position illustrated in FIG. 4. Daughtercard 16 is then inserted into socket in the direction of arrow 60. When bottom surface 38 of daughtercard 16 engages bottom surface 36 of ejector 22, ejector 22 begins to rotate about axles 28 in the direction of arrow 62. Daughtercard 16 has a thickness less than the thickness of slot 32 but greater than the distance separating raised surfaces 48 and 50 as illustrated in FIG. 5. Therefore, as ejector 22 rotates in the direction of arrow 62 during insertion of daughtercard 16, end edge 34 of daughtercard 16 engages ramps 52 and 54 of raised surfaces 48 and 50, respectively, to force side panels 40 and 42 away from each other in the directions of arrows 64 in FIG. 5 to permit daughtercard 16 to enter slot 32. As ejector 22 continues to rotate in the direction of arrow 62, ejector 22 moves to the position illustrated in FIG. 3 so that locking head 44 enters notch 46. First and second side panels 40 and 42 form spring arms to apply a normal retention force through raised surfaces 48 and 50, respectively, in the direction of arrows 66 upon insertion of daughtercard 16 into socket 10.

It is understood that ejector 22 is used only with daughtercard 16 having a suitable notch 46. Use with daughtercards which do not have the notch 46 would cause locking head 44 to hit the end edge 34 of daughtercard and prevent full insertion of daughtercard 16 into socket 10.

Although the invention has been described in detail with reference to a certain preferred embodiment, variations and modifications exist within the scope and spirit of the invention as described and defined in the following claims.

What is claimed is:

1. An ejector apparatus configured to be coupled to an electrical connector socket which is formed to include an elongated slot for receiving a daughtercard, the socket having a plurality of electrical terminals configured to engage a plurality of conductive surfaces formed on the daughtercard for electrically coupling the daughtercard to the socket, the daughtercard being formed to include an opening located in close proximity to an end edge of the daughtercard, the ejector apparatus comprising first and second spring arms located on opposite sides of the elongated slot, at least one spring arm including a head configured to enter the opening in the daughtercard to provide a first retention force on the daughtercard, each spring arm also including a raised surface located adjacent the head, each raised surface being configured to engage a side surface of the daughtercard upon insertion of the daughtercard into the socket to provide a second retention force on the daughtercard in a direction normal to the first retention force, the ejector also including a surface configured to eject an end of the daughtercard located adjacent the ejector out of the elongated slot upon movement of the ejector relative to the socket.

2. The ejector apparatus of claim 1, wherein the first and second spring arms define a slot for receiving the end edge of the daughtercard.

3. The ejector apparatus of claim 1, wherein the raised surfaces formed on the first and second spring arms each include a leading ramp surface configured to engage the daughtercard to facilitate insertion of the daughtercard into the socket.

4. The ejector apparatus of claim 1, wherein the ejector is pivotably coupled to an end of the socket, the ejector being movable from an upright retention position for retaining the daughtercard in the socket to an outwardly pivoted ejection position to force the end of the daughtercard adjacent the ejector out of the elongated slot.

5. An elongated and slotted electrical connector for receiving a circuit card having an opening adjacent an end edge thereof, the improvement comprising an ejector for ejecting the circuit card and for engaging into the opening to hold the card in the connector, the ejector having raised portions for engaging the card to provide a retention force normal to a side surface of the card.

6. An elongated and slotted electrical connector of the type having a movable ejector for holding a board and ejecting the board, the ejector comprising at least one spring arm for engaging the board with a retention force directed toward the connector, the at least one spring arm further having a raised portion for applying a retention force on the board in a direction normal to a side surface of the board.

7. An electrical connector for receiving a daughtercard having an opening located in close proximity to an end edge and having a plurality of conductive surfaces formed thereon, the connector comprising:

a socket formed to include an elongated slot for receiving the daughtercard, the socket having a plurality of electrical terminals configured to engage the plurality of conductive surfaces formed on the daughtercard for electrically coupling the daughtercard to the socket; and an ejector including first and second spring arms located on opposite sides of the elongated slot, at least one spring arm including a head configured to enter the opening in the daughtercard to provide a first retention force on the daughtercard, at least one of the spring arms also including a raised surface located adjacent the head to engage a side surface of the daughtercard upon insertion of the daughtercard into the socket to provide a second retention force on the daughtercard in a direction normal to the first retention force, the ejector also including a surface configured to eject an end of the daughtercard located adjacent the ejector out of the elongated slot upon movement of the ejector relative to the socket.

8. The apparatus of claim 7, wherein the first and second spring arms define a slot for receiving the end edge of the daughtercard.

9. The apparatus of claim 7, wherein each raised surface includes a leading ramp surface configured to engage the daughtercard to facilitate insertion of the daughtercard into the socket.

10. The apparatus of claim 7, wherein the ejector is pivotably coupled to an end of the socket, the ejector being movable from an upright retention position for retaining the daughtercard in the socket to an outwardly pivoted ejection position to force the end of the daughtercard adjacent the ejector out of the elongated slot.

* * * * *